US005537449A

United States Patent [19]

Nezu

[11] Patent Number: 5,537,449

[45] Date of Patent: Jul. 16, 1996

[54] CLOCK SYNCHRONIZING CIRCUITRY HAVING A FAST TUNING CIRCUIT

[75] Inventor: Toshiya Nezu, Tokyo, Japan

[73] Assignee: NEC Corporation, Tokyo, Japan

[21] Appl. No.: 495,973

[22] Filed: Jun. 28, 1995

[30] Foreign Application Priority Data

Jun. 29, 1994 [JP] Japan .................................... 6-147379

[51] Int. Cl.$^{6}$ ........................................................ H03D 3/24

[52] U.S. Cl. ............................ 375/376; 331/16; 327/141; 327/155

[58] Field of Search ..................................... 375/354, 359, 375/376, 373, 375, 362; 331/14, 16; 327/141, 155, 156; 370/100.1, 103.5

[56] References Cited

U.S. PATENT DOCUMENTS 4,215,430 7/1980 Johnson, Jr. ............................ 375/376
4,376,268 3/1983 Moriya et al. .......................... 375/376
5,375,148 12/1994 Parker et al. .......................... 375/376
5,469,478 11/1995 Lee ......................................... 375/373

*Primary Examiner*—Stephen Chin
*Assistant Examiner*—Thuy L. Nguyen
*Attorney, Agent, or Firm*—Whitham, Curtis, Whitham & McGinn

[57] ABSTRACT

Clock synchronizing circuitry with a fast tuning circuit has a differentiator for detecting the advanced/delayed state of the phase of an input clock signal and that of an output clock signal. A control amount is changed on the basis of the transition points of the detected phases. Only fast tuning control is executed with usual tuning control masked. Every time a transition point is detected, a selector halves the amount of control. After the control amount has reached ±1, the fast tuning control is ended on the detection of the next transition point. Because this kind of control involves a difference between frequency tuning and phase tuning, an integrator calculates a correction amount. One half each control amount is added in the opposite polarity as a correction amount. As a result, fast clock synchronization is achieved.

8 Claims, 4 Drawing Sheets

CLOCK SYNCHRONIZING CIRCUITRY HAVING A FAST TUNING CIRCUIT

BACKGROUND OF THE INVENTION

The present invention relates to clock synchronizing circuitry and, more particularly, to clock synchronizing circuitry having a fast tuning circuit and for synchronizing, in a network, a clock signal to be generated in a terminal node to a clock signal received from a clock feeding device included in a master node.

It is a common practice with a large scale digital communication network to implement a network synchronizing system with a master-slave scheme. In a master-slave synchronizing system, a master node generates a clock signal with a clock generating device thereof and sends it to a terminal node. The terminal node generates a clock signal based on the received clock thereinside. Conventional clock synchronizing circuitry using the master-slave scheme has a phase difference detector for producing a voltage signal representative of a phase difference between an input and an output clock signal, a low pass filter, and a voltage controlled oscillator (VCO) for producing a predetermined clock signal matching the voltage signal. The problem with such clock synchronizing circuitry is as follows. The frequency of the output clock signal is controlled on the basis of the phase difference between an input and an output clock signal. Hence, when the frequency of the input clock signal, which is the reference, is changed or shut off for a moment due to jitter or similar cause, the phase difference detector detects the change or shut-off and feeds the resulting output thereof to the VCO as a phase difference signal. As a result, the VCO outputs a clock signal proportional to the change in the frequency of the input clock signal. Moreover, in an application of the kind requiring a stable output clock signal, uncontrollable phase deviations occur because the output clock signal is controlled on the basis of a variation width produced by a temperature compensation circuit which is included in the VCO.

U.S. patent application Ser. No. 08/186,522 filed Jan. 26, 1994, now U.S. Pat. No. 5,475,325 issued on Dec. 12, 1995 which is incorporated herein by reference, has proposed clock synchronizing circuitry with an implementation for eliminating the above problems, as follows. .Assume that at the time when the circuitry is reset due to power-on, i.e., when it is started up, an input clock fin has a frequency noticeably deviated from the center frequency of a VCO 5. Then, the circuitry sequentially tunes the VCO 5 to the input clock fin by using control amounts A and B set in a frequency phase control circuit 3. The control amounts A and B are of such a degree that they do not cause errors to occur in the following system. As a result, a long tuning time is required after the start-up of the circuitry. This increases the period of time necessary for a terminal node, forming a synchronous network based on an output clock $f_{out}$, to become operable stably.

SUMMARY OF THE INVENTION

It is, therefore, an object of the present invention to provide clock synchronizing circuitry having a fast tuning circuit and capable of reducing the tuning time at the time of power-on resetting.

Clock synchronizing circuitry of the present invention has a phase comparator for detecting a phase difference between an input clock and an oscillation clock oscillated by an internal oscillator. A predetermined amount of control signals is generated during a first period of time between a transition point of the polarity of the phase difference and the next transition point. Then, during each of successive periods of time following the first period of time, an amount of control signals, which is one half of the amount generated in the immediately preceding period of time, are generated until a predetermined minimum amount of control signal has been reached. An integrated amount of the control signals is calculated for each of the periods of time, and a correction signal matching the integrated amount is generated. The correction signal is combined with the control signals for each of the periods of time to thereby generate a corrected control signal. At the time of power-on resetting, the corrected control signal is substituted for the frequency and phase control signal from the phase comparator in order to control the frequency and phase of the oscillation clock.

The above circuitry generates a control amount for fast tuning beforehand and delivers it to a VCO at the time of power-on resetting. Hence, at the time of system start-up, the period of time necessary for a terminal node to become stable is reduced.

BRIEF DESCRIPTION OF THE DRAWINGS

The above and other objects, features and advantages of the present invention will become more apparent from the following detailed description taken with the accompanying drawings in which.

DETAILED DESCRIPTION OF THE PREFERRED EMBODIMENT

Figure 1:
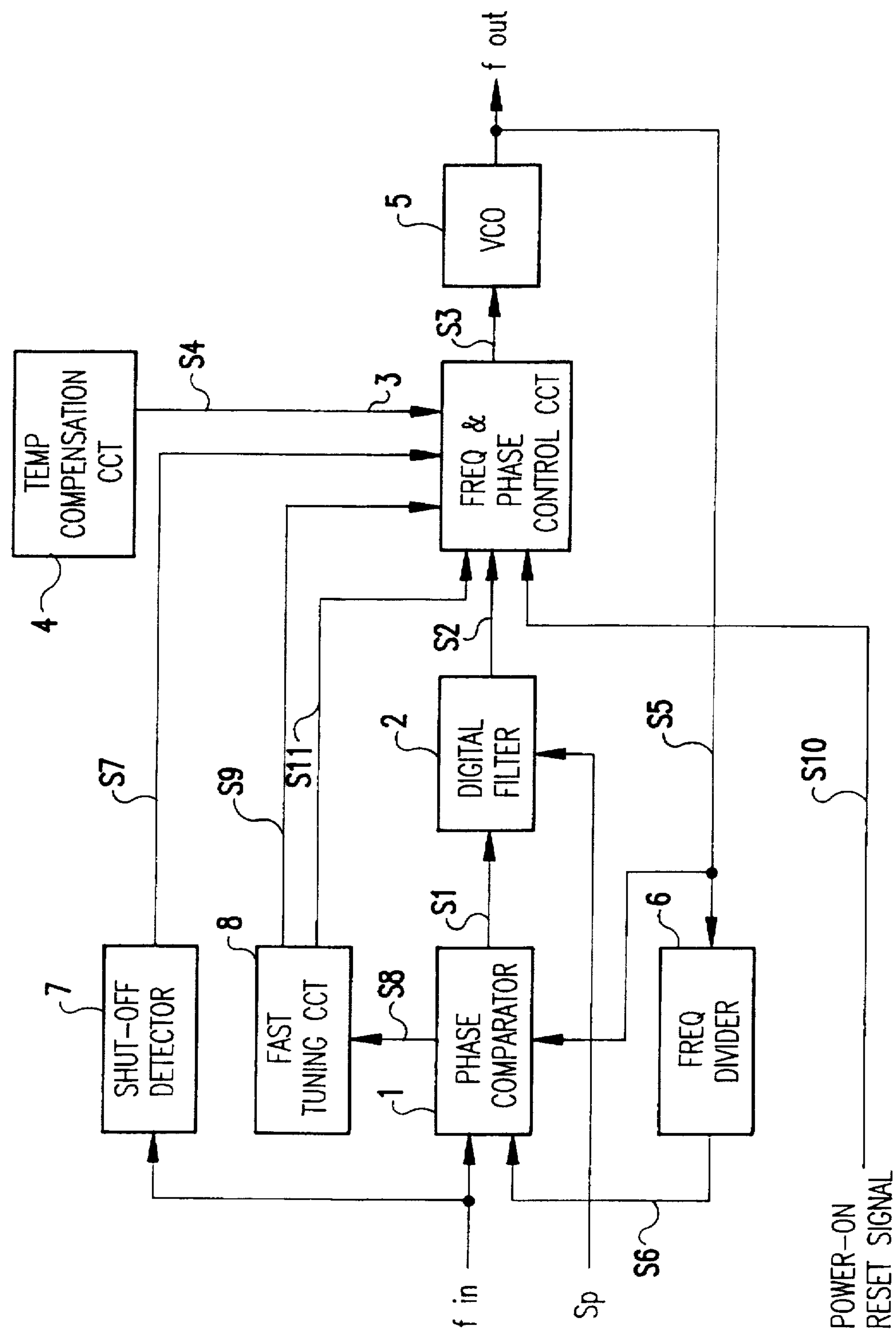
FIG. 1 is a block diagram schematically showing clock synchronizing circuitry embodying the present invention.

Referring to FIG. 1 of the drawings, clock synchronizing circuitry embodying the present invention is shown. As shown, in response to an input clock signal $f_{in}$, the circuitry produces an output clock signal $f_{out}$ whose frequency is substantially n times as high as the frequency of the signal $f_{in}$. Specifically, the input clock signal $f_{in}$ is sent from a clock feeding device included in a master node, not shown, to the circuitry via a network. A phase comparator 1 compares the clock signal $f_{in}$ with a signal $S_6$ which a frequency divider 6 outputs by dividing the output clock signal $f_{out}$ by 6. The phase comparator 1 delivers a digital signal $S_1$ representative of the phase difference between the two signals $f_{in}$ and $S_6$. A digital filter 2 removes phase fluctuation components of relatively high frequencies from the phase difference signal $S_1$, thereby producing a phase indication signal $S_2$ indicative of the advance/retard direction of the phase. A temperature compensation circuit 4 generates a temperature compensation signal $S_4$ matching the current amibent temperature. A fast tuning circuit 8 generates a fast tuning control signal $S_9$ and a fast tuning end signal $S_{11}$ in response to a phase difference signal $S_8$ fed from the phase comparator 1. The signals $S_9$ and $S_{11}$ are applied to a frequency and phase control circuit 3.

The frequency and phase control circuit 3 adds the temperature compensation signal $S_4$ and a control signal resulted from frequency and phase synchronization control which is based on the phase indication signal $S_2$ or the control signal $S_9$. In the illustrative embodiment, the signal $S_9$ is used in response to a power-on reset signal, or the signal $S_2$ is used in response to the fast tuning end signal $S_{11}$. The resulting output, or voltage control signal, $S_3$ of the control circuit 3 is applied to a VCO 5. In response, the VCO 5 generates an output clock signal $F_{out}$ based on a predetermined internal oscillation frequency. When the input clock signal $f_{in}$ is shut off due to jitter or similar cause, a signal shut-off detector 7 detects it and generates an input shut-off signal $S_7$.

Figure 2:
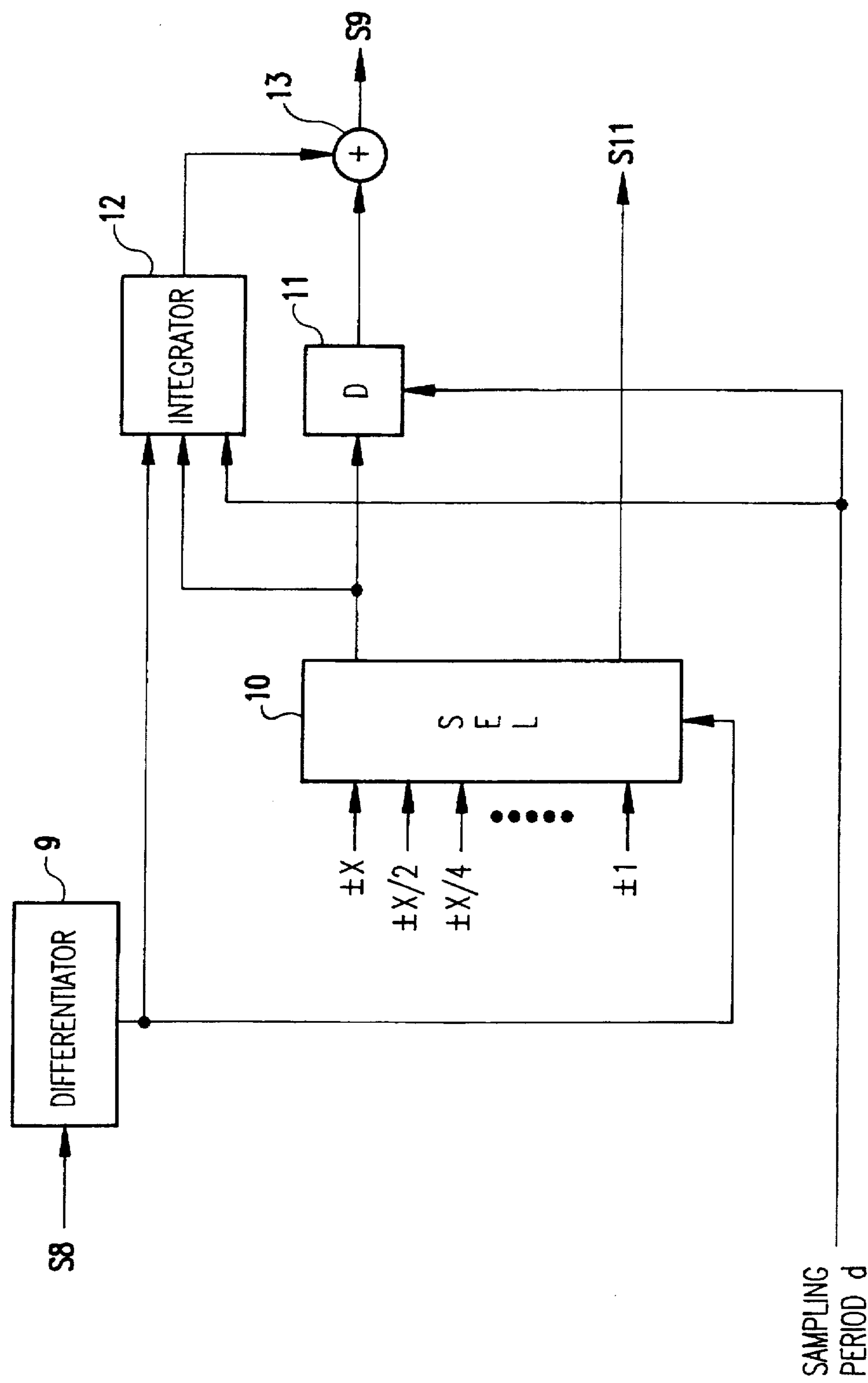
FIG. 2 is a schematic block diagram showing a fast tuning circuit included in the embodiment specifically.

The fast tuning circuit 8 is shown in FIG. 2 specifically and includes a differentiator 9. The differentiator 9 detects the transition points of the phase difference signal $S_8$ from the comparator 1 and generates a detection timing signal for every transition point. The consecutive timing signals are fed to a selector 10 and an integrator 12. Specifically, the phase comparator 1, comparing the phase of the input clock signal $f_{in}$ and that of the signal $S_6$, generates a phase difference voltage corresponding to the absolute value of the phase difference, and a polarity signal indicative of the polarity (positive or negative) of the phase difference. The differentiator 9 detects the transition points of the polarity signal $S_8$.

Figure 4:
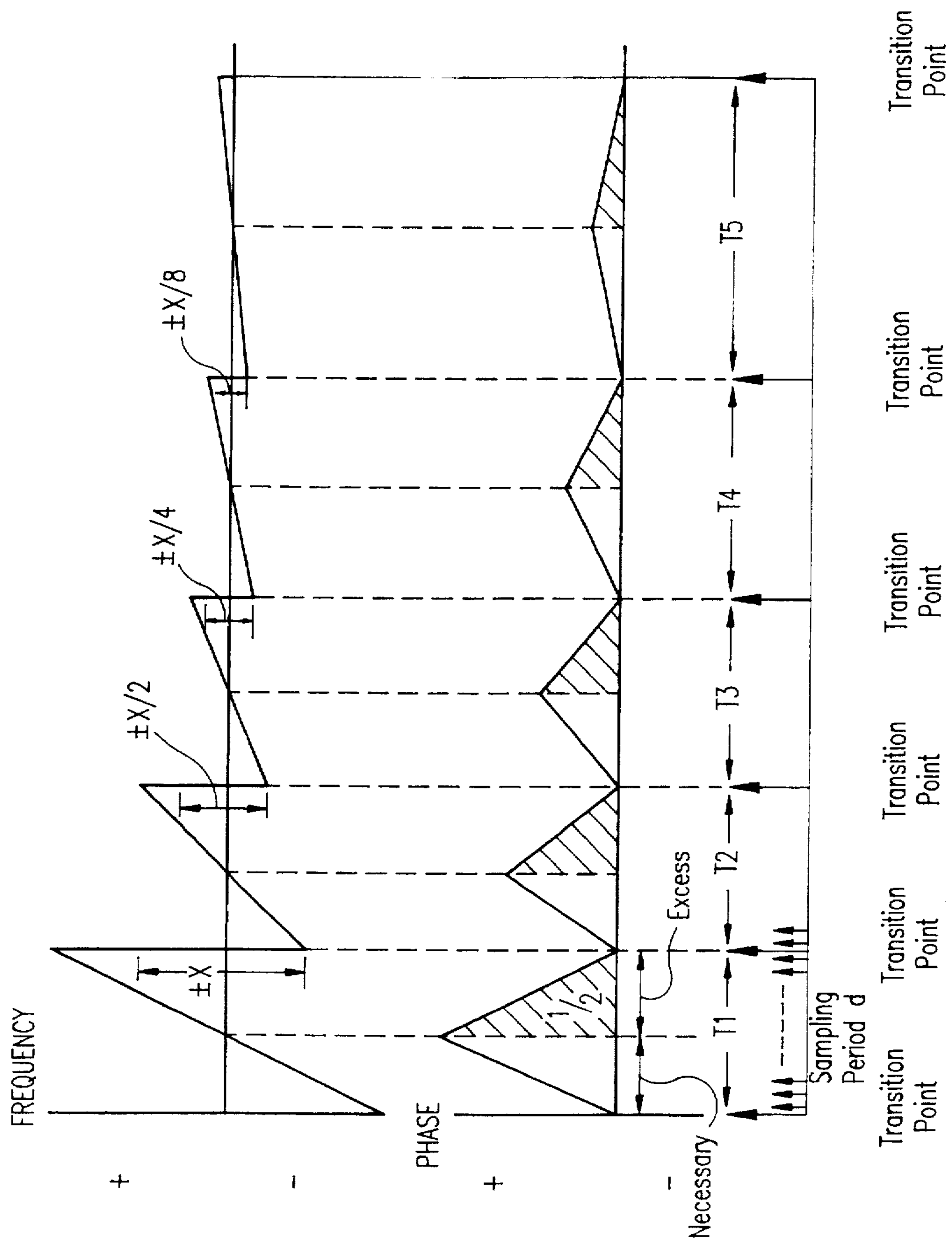
FIG. 4 is a timing chart demonstrating a specific operation of the embodiment.

The polarity signal $S_8$ is logical ONE when the polarity of the phase difference is positive or logical ZERO when it is negative. The differentiator 9 determines a change in tuning frequency at every point of transition from ONE to ZERO or from ZERO to ONE. FIG. 4 shows a specific change in the relation between the frequency and the phase of the signal $S_6$ with respect to the input clock $f_{in}$ and to occur at the time of power-on resetting.

More specifically, the polarity signal $S_8$ changes when the phase of the signal $S_6$ crosses the center of the phase of the input clock $f_{in}$. The differentiator 9 determines, based on the transition points of the signal $S_8$, how the phase of the signal $S_6$ goes back and forth across the center of the phase of the input clock $f_{in}$. The resulting detection signals from the differentiator 9 are used to select consecutive digital control amounts ±X, ±X/2, ±X/4, . . . , ±1 set in a selector 10 beforehand. In the specific case shown in FIG. 4, the amount ±X is selected for a first period of time $T_1$ extending from the first transition point to the second transition point; the amount ±X/2 is selected for a period of time $T_2$ between the second and third transition points; and the amount ±X/4 is selected for a period of time $T_3$ between the third and fourth transition points. That is, for each given period of time, a control amount one half of the control amount selected for the preceding period of time is selected. This is repeated until the control amount reaches ±1.

During each period of time $T_i$ (i=1, 2, 3, . . .), a flip-flop (F/F) 11 samples the control amounts at a sampling period d, as shown in FIG. 4. The outputs of the F/F 11 are applied to an adder 13. The control amounts are determined on the basis of the number of quantizing steps assigned to a digital-to-analog converter (DAC) 37 (see FIG. 3); the last or minimum control amount ±1 corresponds to the quantizing step of the DAC 37, For example, the quantizing step of the DAC 37 is about 91.55 μV/step. Further, the VCO 5, FIG. 1, which follows the DAC 37 has a voltage frequency conversion characteristic of about 25 ppm/V. Hence, as to the frequency which can be controlled by a single step, assume that the VCO 5 has a frequency of 12.96 MHz. Then, this frequency is equal to about $1.8\times10^{-7}$ ns in terms of phase. With these values, it is possible to determine the initial control amount ±X. In the above specific condition, the sampling period d of the F/F 11 may be 5 ms by way of example.

In the event of power-on resetting, the frequency and phase control circuit 3 reduces original control amounts A and B to "0", as will be described later specifically. Then, the control signal $S_9$ is fed from the fast tuning circuit 8 to an adder 32 (FIG. 3) and added to the previous control signal input to the adder 32 as a frequency hold signal $S_{33}$. In this manner, frequency hold control is executed.

The embodiment causes the adder 32 to add up the control signals $S_9$ while changing the control amount stepwise in the consecutive periods of time $T_1$, $T_2$, . . . At this instant, a difference occurs between frequency tuning and phase tuning. Specifically, as shown in FIG. 4, when the frequency is coincident, the phase is farthest, and vice versa. Because the synchronizing system executes VCO control by phase comparison, the time when a transition in phase is detected is the time when the frequency is most deviated. Hence, when the control amount is applied in the opposite polarity at a phase transition point, the time loss is aggravated because tuning begings at the time when the frequency is most deviated.

When a certain transition point is detected, the control amount from the time when the immediately preceding transition point was detected, i.e., the total control amount is produced as follows. Assume that the control amount ±X is added α times at the sampling period d during the interval between the two transition points ($T_1$, $T_2$, . . .). Then, the total control amount Z is equal to ±αX. The problem is that the total control amount Z is twice as much as the necessary control amount when a phase transition point is detected, as stated previously (see FIG. 4). In the illustrative embodiment, when a transition point is detected, one half of the total control amount from the previous transition point is added in the opposite polarity by the adder 13 for a correction purpose. With this control, the embodiment achieves a certain degree of fast tuning while reducing the width of variation of the phase and frequency. This is why the integrator 12 is used.

More specifically, how many times the selective control amounts of the selector 10 have been sampled at the period d within the interval between two consecutive transition points is determined. Then, the control amounts were added to produce a total control amount Z. One half of the total control amount Z is fed to the adder 13 in the opposite polarity.

In the embodiment, when a transition in phase difference is detected, a frequency dividing counter included in the frequency divider 6 (FIG. 1) is reset in order to match the operation in phase to the input clock $f_{in}$. It is to be noted that the resetting of the counter occurs at every transition point only during fast tuning at the time of power-on resetting, although not shown in the figures. In this manner, the correction amount brings the frequency closer to the frequency of the input clock $f_{in}$, while the resetting of the counter prevents the phase from being deviated.

Figure 3:
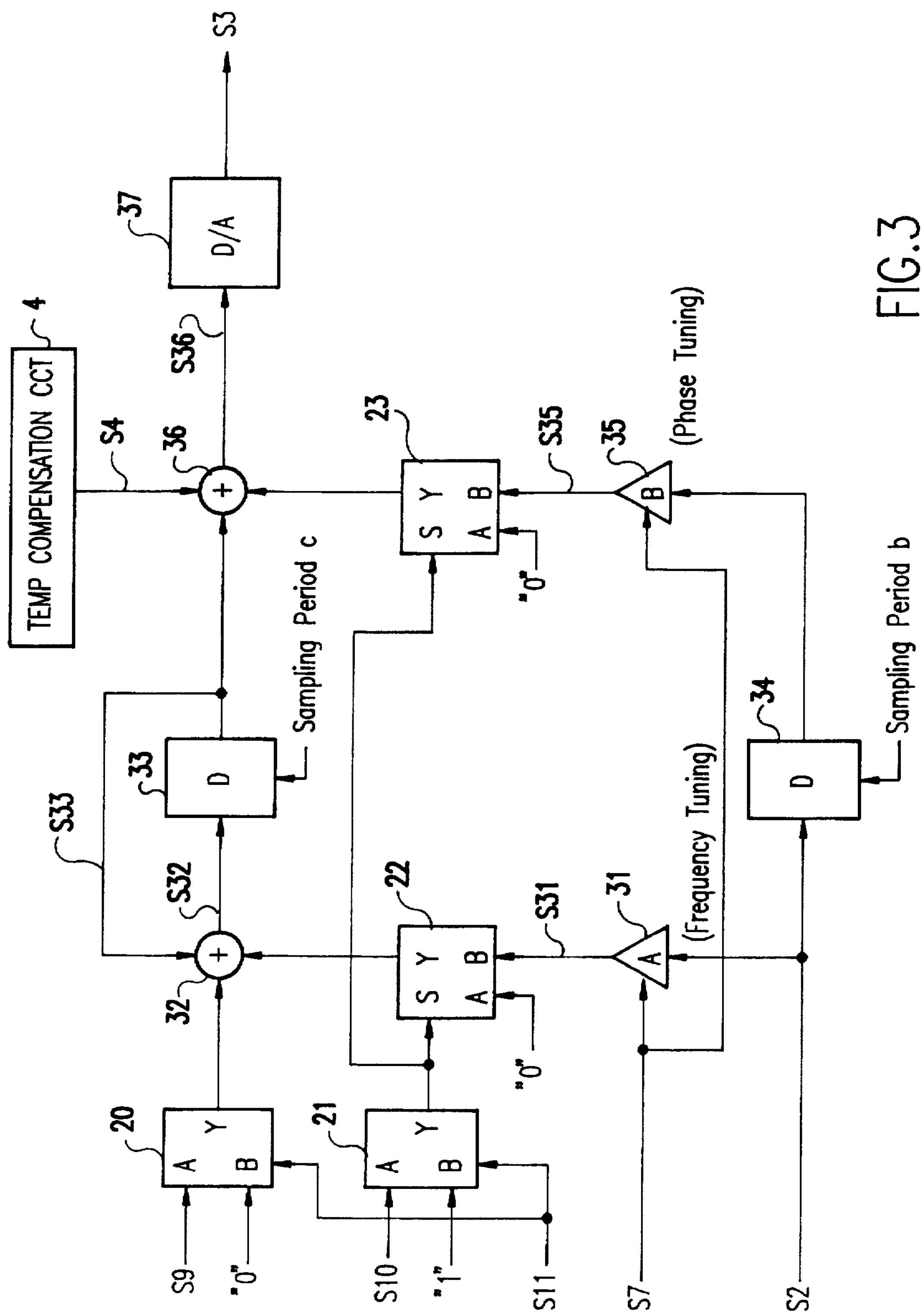
FIG. 3 is a schematic block diagram showing a frequency and phase control circuit also included in the embodiment.

FIG. 3 shows a specific construction of the frequency and phase control circuit 3. As shown, the circuit 3 has buffers 31 and 35 each outputting a predetermined control amount in response to an input signal. F/Fs 33 and 34 each samples an input signal on the basis of a sampling signal having a preselected period. The DAC 37 transforms a digital input to an analog output. On the arrival of a phase difference signal $S_2$, frequency tuning is effected, as follows. The buffer 31 delivers a predetermined control amount A matching the signal S2 to the adder 32. Specifically, the control amount ±A is output on the basis of the logical ZERO/ONE of the signal $S_2$. The adder 32 adds the output $S_{31}$ of the buffer 31 to a signal $S_{33}$ fed back from the F/F 33. The F/F 33 samples the resulting output of the buffer 31 at a predetermined sampling period a. The output of the F/F 33 is applied to the adder 36. More specifically, a new control amount A (signal $S_{31}$) is added to the last control amount S33, thereby holding the frequency.

The frequency tuning described above can execute, when the phase difference is great, frequency control between the input and output clock signals efficiently.

Phase tuning is executed, as follows. The F/F 34 samples the phase difference signal $S_2$ at a predetermined sampling period b. In response to the output of the F/F 34, the buffer 35 delivers a predetermined control amount B (signal $S_{35}$) to the adder 36, i.e., ±B is output on the basis of the logical ZERO/ONE of the signal $S_2$. Hence, when the phase difference is small, such phase tuning executes phase control between the input and output clock signals delicately by use of the control amount B.

The temperature compensation circuit 4 outputs a compensation signal $S_4$ for the VCO 5 on the basis of the current temperature. With the circuit 4, it is possible to correct the frequency-to-temperature characteristic of the VCO 5 from the outside smoothly and in a desired way. This successfully prevents the phase of the output clock signal from deviating unexpectedly.

The adder 36 adds the control signal $S_{33}$ derived from the frequency tuning, the control signal $S_{35}$ derived from the phase tuning, and the temperature compensation signal $S_4$. The output $S_{36}$ of the adder 36 is output via the DAC 37 as a voltage control signal $S_3$. On receiving the signal $S_3$, the VCO 5 adjusts its oscillation signal and thereby outputs a stable clock signal $f_{out}$.

When the signal shut-off detector 7 (FIG. 1) detects the shut-off of the input clock signal $f_{in}$, it delivers a shut-off signal $S_7$ to the buffers 31 and 35. In response, the buffers 31 and 35 each fixes the control amount at "0". As a result, as for frequency tuning, the adder 32 holds its output appeared immediately before the signal shut-off. As for phase tuning, the output is held at "0". Hence, the frequency and phase control circuit 3 holds its output or voltage control signal $S_3$ appeared immediately before the signal shut-off. Consequently, the output clock signal $f_{out}$ from the VCO 5 does not change despite the interruption of the input clock signal $f_{in}$.

In FIG. 3, the reference numerals 20–23 designate 2:1 selectors. The selector 10, FIG. 2, outputs the previously mentioned signal $S_{11}$ indicative of the end of fast tuning when the minimum control amount ±1 is selected. The 2:1 selectors 20 and 21 respectively select the fast tuning control amount $S_9$ from the fast tuning circuit 8 and a power-on reset signal $S_{10}$ until the selector 10 generates the signal $S_{11}$. The power-on reset signal from the selector 21 is applied to the selection inputs of the selectors 22 and 23. In response, the selectors 22 and 23 shut off the outputs of the buffers 31 and 35. As a result, the fast tuning control amount $S_9$ from the circuit 8 is fed to the adder 32 via the selector 20, thereby effecting fast tuning. When the selector 10 generates the signal S11, the selectors 22 and 23 select the control amounts A and B for usual timing. Hence, the circuitry resumes the usual tuning operation as distinguished from the fast tuning operation.

What is claimed is:

1. A fast tuning circuit for clock synchronizing circuitry for detecting a phase difference between an input clock and an oscillation clock oscillated by an internal oscillator with a phase comparator, for generating a frequency and phase control signal matching said phase difference, and for controlling a frequency and a phase of said oscillation clock while adding to a latest frequency control signal an immediately preceding frequency control signal, said fast tuning circuit comprising:

control signal generating means for generating a predetermined amount of control signals during a first period of time between a transition point of a polarity of the phase difference and the next transition point, and for generating, during each of successive periods of time following said first period of time, an amount of control signals which is one half of the amount generated in the immediately preceding period of time, until a predetermined minimum amount of control signal has been reached;

correction signal generating means for calculating an integrated amount of said control signals for each of the periods of time, and for generating a correction signal matching said integrated amount; and means for combining said correction signal with said control signals for each of said periods of time to thereby generate a corrected control signal, and for substituting, at a time of power-on resetting, said corrected control signal for said frequency and phase control signal from said phase comparator in order to control the frequency and phase of said oscillation clock.

2. A circuit as claimed in claim 1, wherein said control signals generated during each of said periods of time comprise a particular amount of control signals generated in each of said periods of time at a predetermined period, and wherein said correction signal generating means comprises integrating means for integrating said control signals appeared during each of said periods of time.

3. A circuit as claimed in claim 1, further comprising temperature compensating means for reducing a change in an oscillation frequency of said internal oscillator attributable to temperature.

4. A circuit as claimed in claim 1, further comprising means for controlling, when said input clock is shut off, said internal oscillator while maintaining frequency and phase difference information appearing immediately before a shut-off.

5. A circuit as claimed in claim 2, further comprising temperature compensating means for reducing a change in an oscillation frequency of said internal oscillator attributable to temperature.

6. A circuit as claimed in claim 2, further comprising means for controlling, when said input clock is shut off, said internal oscillator while maintaining frequency and phase difference information appearing immediately before a shut-off.

7. A circuit as claimed in claim 3, further comprising means for controlling, when said input clock is shut off, said internal oscillator while maintaining frequency and phase difference information appearing immediately before a shut-off.

8. A circuit as claimed in claim 5, further comprising means for controlling, when said input clock is shut off, said internal oscillator while maintaining frequency and phase difference information appearing immediately before a shut-off.

* * * * *